(12) United States Patent
Kim et al.

(10) Patent No.: US 9,941,336 B2
(45) Date of Patent: Apr. 10, 2018

(54) LIGHT EMITTING DISPLAY DEVICE AND METHOD FOR FABRICATING THE SAME

(71) Applicant: SAMSUNG DISPLAY CO., LTD., Yongin-si, Gyeonggi-do (KR)

(72) Inventors: Geun Tak Kim, Hwaseong-si (KR); Kyoung Wook Min, Suwon-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 14 days.

(21) Appl. No.: 15/133,458

(22) Filed: Apr. 20, 2016

(65) Prior Publication Data

US 2017/0098687 A1   Apr. 6, 2017

(30) Foreign Application Priority Data

Oct. 6, 2015   (KR) .................. 10-2015-0140245

(51) Int. Cl.
*H01L 27/32* (2006.01)
*H01L 51/56* (2006.01)
*H01L 51/50* (2006.01)

(52) U.S. Cl.
CPC ...... *H01L 27/3246* (2013.01); *H01L 27/3211* (2013.01); *H01L 27/3223* (2013.01); *H01L 51/56* (2013.01); *H01L 51/5056* (2013.01); *H01L 51/5088* (2013.01); *H01L 2227/323* (2013.01)

(58) Field of Classification Search
None
See application file for complete search history.

(56) References Cited

U.S. PATENT DOCUMENTS

| 8,124,172 | B2 | 2/2012 | Lang et al. | |
| 9,006,969 | B2* | 4/2015 | Kim | H01L 51/50 |
| | | | | 313/506 |
| 9,530,827 | B2* | 12/2016 | Kim | H01L 51/5072 |

(Continued)

FOREIGN PATENT DOCUMENTS

KR   10-2014-0124069 A   10/2014

*Primary Examiner* — Abul Kalam
(74) *Attorney, Agent, or Firm* — Lee & Morse, P.C.

(57) ABSTRACT

The light emitting display device comprises: a substrate including a plurality of pixels that are arranged in a first direction and a second direction that crosses the first direction; a first electrode for each pixel on the substrate; a pixel defining layer on the substrate, the pixel defining layer having an opening for exposing the first electrode; a hole injection layer on the first electrode; a lyophilic pattern extending on the hole injection layer to cover the first electrode and the pixel defining layer that are on a same line in the first direction, and extending up to an outer region of outermost pixels of the plurality of pixels in the first direction; a hole transport layer on the lyophilic pattern; a light emitting layer on the hole transport layer; and a second electrode on the light emitting layer, wherein the lyophilic pattern includes a first lyophilic pattern having a plurality of grooves on one end portion thereof in the first direction and a second lyophilic pattern having a plurality of grooves on another end portion thereof in the first direction, and wherein the first lyophilic pattern and the second lyophilic pattern are alternately arranged in the second direction.

20 Claims, 21 Drawing Sheets

(56) References Cited

U.S. PATENT DOCUMENTS

| | | | | |
|---|---|---|---|---|
| 2014/0097414 A1* | 4/2014 | Kim, II | ............... | H01L 51/0003 257/40 |
| 2014/0306601 A1* | 10/2014 | Kim | ........................ | H01L 51/50 313/506 |
| 2016/0056219 A1* | 2/2016 | Kim | .................... | H01L 51/5072 257/40 |
| 2016/0133676 A1* | 5/2016 | Kim | .................... | H01L 27/3246 257/40 |
| 2016/0380224 A1* | 12/2016 | Kim | .................... | H01L 51/5056 257/40 |

* cited by examiner

LIGHT EMITTING DISPLAY DEVICE AND METHOD FOR FABRICATING THE SAME

CROSS-REFERENCE TO RELATED APPLICATION

Korean Patent Application No. 10-2015-0140245, filed on Oct. 6, 2015, in the Korean Intellectual Property Office, and entitled: "Light Emitting Display Device and Method for Fabricating the Same," is incorporated by reference herein in its entirety.

BACKGROUND

1. Field

Exemplary embodiments relate to a light emitting display device and a method for fabricating the same.

2. Description of the Related Art

Among light emitting display devices, an organic light emitting display device is a self-luminous display device which may have a wide viewing angle, superior contrast, and high response speed.

An organic light emitting display device has a light emitting layer that is made of an organic light emitting material disposed between an anode electrode and a cathode electrode. If anode and cathode voltages are respectively applied to these electrodes, holes injected from the anode electrode may move to the light emitting layer through a hole injection layer and a hole transport layer, and electrons may move from the cathode electrode to the light emitting layer through an electron injection layer and an electron transport layer. In the light emitting layer, the electrons and the holes are recombined and, through this recombination, excitons are generated. As the generated excitons are transited from an excited state to a ground state, the light emitting layer emits light to display an image.

Such an organic light emitting display device includes a pixel defining layer having an opening for exposing an anode electrode that is formed on pixels arranged on a substrate in a matrix form. Additionally, a hole injection layer, a hole transport layer, a light emitting layer, an electron transport layer, an electron injection layer, and a cathode electrode are formed on the anode electrode that is exposed through the opening of the pixel defining layer.

SUMMARY

In an exemplary embodiment, there may be provided a light emitting display device comprising: a substrate including a plurality of pixels that are arranged in a first direction and a second direction that crosses the first direction; a first electrode for each pixel on the substrate; a pixel defining layer on the substrate, the pixel defining layer having an opening for exposing the first electrode; a hole injection layer on the first electrode; a lyophilic pattern extending on the hole injection layer to cover the first electrode and the pixel defining layer that are on a same line in the first direction, and extending up to an outer region of outermost pixels of the plurality of pixels in the first direction; a hole transport layer on the lyophilic pattern; a light emitting layer on the hole transport layer; and a second electrode on the light emitting layer, wherein the lyophilic pattern includes a first lyophilic pattern having a plurality of grooves on one end portion thereof in the first direction and a second lyophilic pattern having a plurality of grooves on another end portion thereof in the first direction, and wherein the first lyophilic pattern and the second lyophilic pattern are alternately arranged in the second direction.

The plurality of grooves of the first and second lyophilic patterns may be in the form of a straight line that extends in the second direction;

The plurality of grooves may have a same width.

Widths of the plurality of grooves may become larger from an inside to an outside in the first direction.

The plurality of grooves may be in the form of a lattice.

The plurality of grooves may be in the form of a slant line between the first direction and the second direction.

The hole transport layer may be conformal along the first lyophilic pattern and the second lyophilic pattern.

The substrate may further include dummy pixels arranged on an outside of the outermost pixels in the first direction.

The plurality of pixels may include pixels that emit a same light emission color in the first direction.

In another exemplary embodiment, there is provided a light emitting display device comprising: a substrate including a plurality of pixels that are arranged in a first direction and a second direction that crosses the first direction; a first electrode for each pixel on the substrate; a pixel defining layer on the substrate, the pixel defining layer having an opening for exposing the first electrode; a hole injection layer on the first electrode; a lyophilic pattern extending on the hole injection layer to cover the first electrode and the pixel defining layer that are on a same line in the first direction, and extending up to an outer region of outermost pixels of the plurality of pixels in the first direction; a hole transport layer on the lyophilic pattern; a light emitting layer on the hole transport layer; and a second electrode on the light emitting layer, wherein the lyophilic pattern includes a first lyophilic pattern group including first lyophilic patterns having a plurality of grooves formed on one end portion thereof in the first direction and a second lyophilic pattern group including second lyophilic patterns having a plurality of grooves formed on another end portion thereof in the first direction, and wherein the first lyophilic pattern group and the second lyophilic pattern group are alternately arranged in the second direction.

The plurality of grooves of the first and second lyophilic patterns may be in the form of a straight line that extends in the second direction.

The plurality of grooves may be in the form of a lattice.

The plurality of grooves may be in the form of a slant line between the first direction and the second direction.

The hole transport layer may be conformal along the first lyophilic pattern and the second lyophilic pattern.

The substrate may further include dummy pixels arranged on an outside of the outermost pixels in the first direction.

The plurality of pixels may include pixels that emit a same light emission color in the first direction.

In another still exemplary embodiment, there is provided a method for fabricating a light emitting display device comprising: forming a first electrode for each pixel on a substrate including a plurality of pixels which are arranged in a first direction and a second direction that crosses the first direction; forming a pixel defining layer partitioning the respective pixels on the substrate and having an opening for exposing the first electrode; forming a hole injection layer on the first electrode; forming a lyophilic pattern extending on the hole injection layer to cover the first electrode and the pixel defining layer that are on a same line in the first direction, and extending up to an outer region of outermost pixels of the plurality of pixels in the first direction; forming a hole transport layer on the lyophilic pattern; forming a light emitting layer on the hole transport layer; and forming a second electrode on the light emitting layer, wherein the forming the lyophilic pattern includes alternately arranging a first lyophilic pattern having a plurality of grooves formed on one end portion thereof in the first direction and a second lyophilic pattern having a plurality of grooves formed on the other end portion thereof in the first direction.

The hole transport layer and the light emitting layer may be formed by a nozzle printing method.

The hole transport layer may be formed by discharging a hole transport solution onto the lyophilic pattern in the first direction using a discharge device and drying the discharged hole transport solution in a state where a cover mask is on an upper portion of the lyophilic pattern, the cover mask including an open portion for exposing the pixels and a blocking portion positioned on an outside of the open portion.

The cover mask may move moves to shift the open portion toward the blocking portion when the discharge of the hole transport solution begins and is performed in a direction from the blocking portion to the open portion of the cover mask, rather than a direction from the open portion to the blocking portion.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
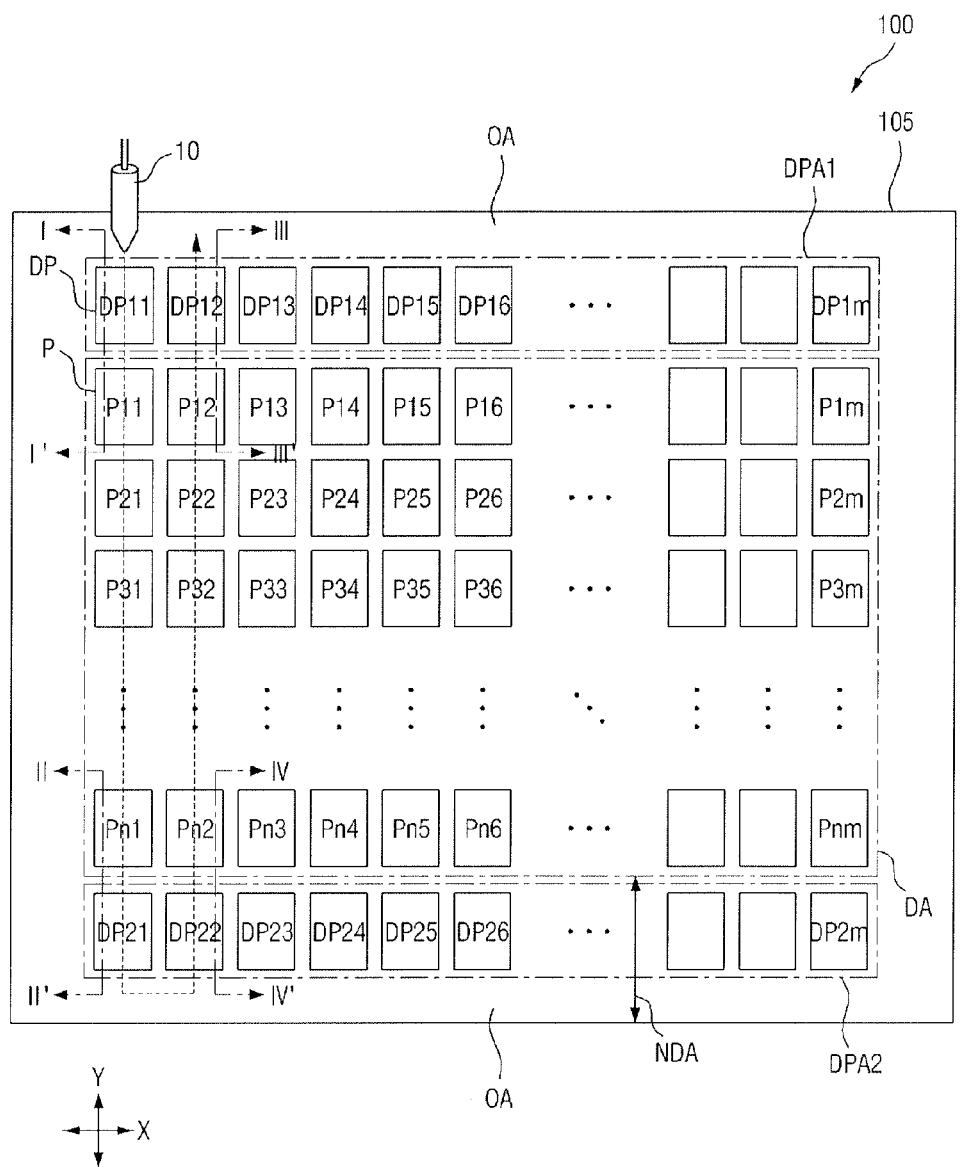
FIG. 1 illustrates a schematic top view illustrating pixels of a light emitting display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section. Like reference numerals refer to like elements throughout.

Figure 2:
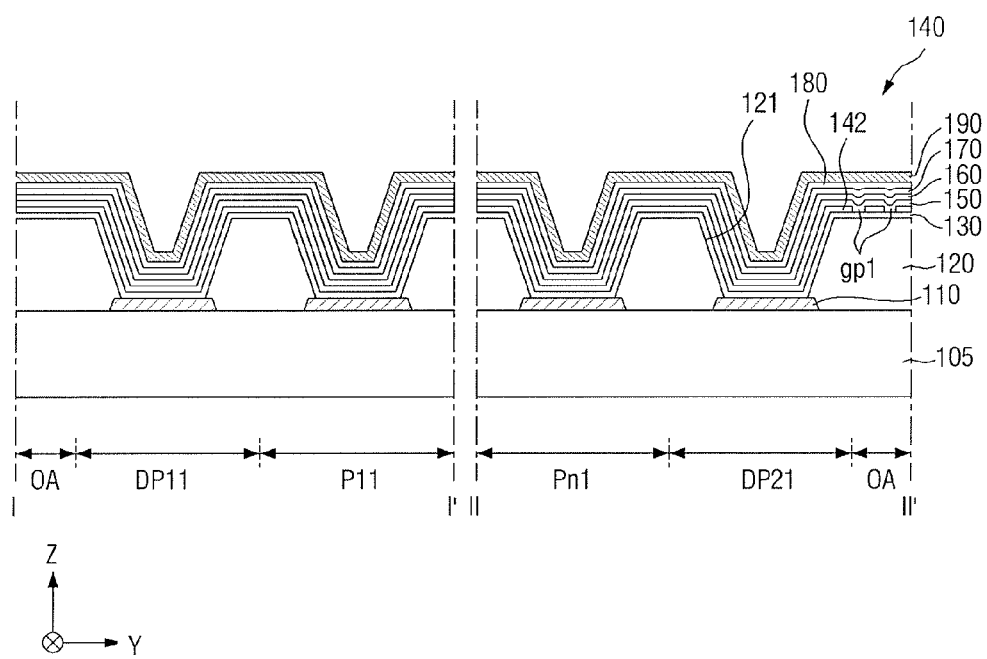
FIG. 2 illustrates a cross-sectional view of a portion that is taken along lines I-I' and II-II' of FIG. 1.

FIG. 1 is a schematic top view illustrating pixels of a light emitting display device according to an exemplary embodiment. FIG. 2 is a cross-sectional view of a portion that is taken along lines I-I' and II-II' of FIG. 1, and FIG. 3 is a cross-sectional view of a portion that is taken along lines III-III' and IV-IV' of FIG. 1.

Figure 3:
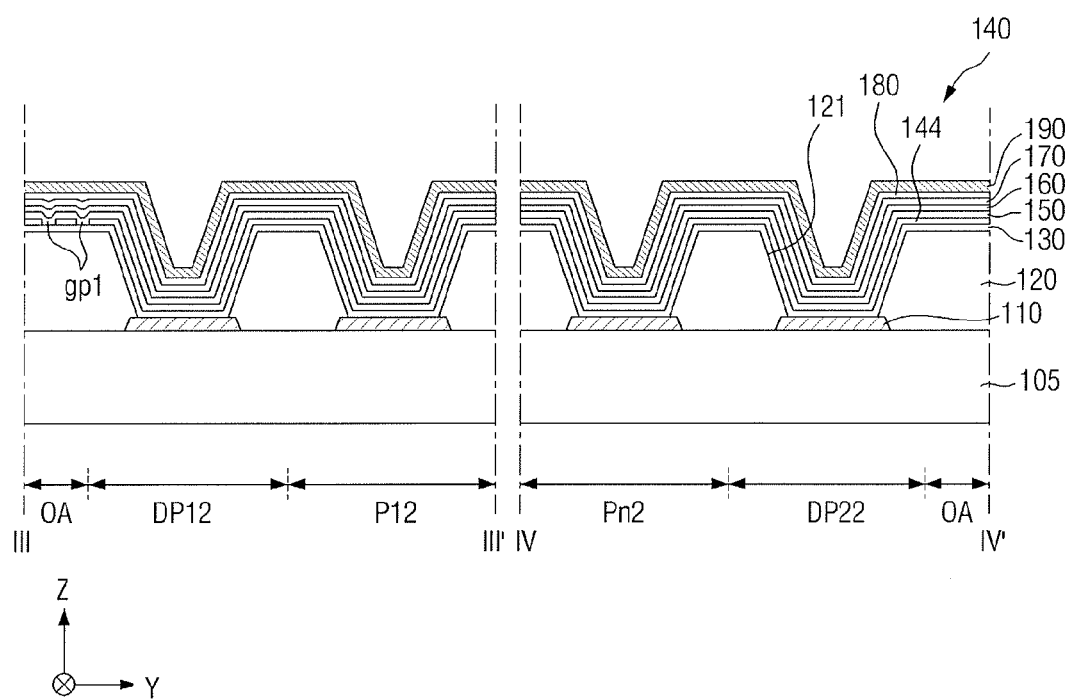
FIG. 3 illustrates a cross-sectional view of a portion that is taken along lines and IV-IV' of FIG. 1.

Referring to FIGS. 1 to 3, a light emitting display device 100 according to an exemplary embodiment may include a substrate 105, a first electrode 110, a pixel defining layer 120, a hole injection layer 130, a lyophilic pattern 140, a hole transport layer 150, a light emitting layer 160, an electron transport layer 170, an electron injection layer 180, and a second electrode 190. Respective members are successively laminated in a Z direction of FIG. 2.

The substrate 105 includes a display region DA in which a plurality of pixels P for displaying an image are defined, and a non-display region NDA that is positioned on an outside of the display region DA.

The plurality of pixels P may be arranged in the form of an n×m (where, n and m are natural numbers) matrix, i.e., in a first direction Y and a second direction X that crosses the first direction Y, and may include red pixels that emit red light, green pixels that emit green light, and blue pixels that emit blue light. As an example, pixels P that emit the same light emission color may be arranged in the first direction Y, and pixels P that emit different light emission colors may be alternately arranged in the second direction X. However, exemplary embodiments are not limited to such an arrangement.

The plurality of pixels P may be divided into a plurality of row groups that are arranged in the first direction Y on the substrate 105. The plurality of row groups may include first to n-th pixel row groups P11 to P1m and Pn1 to Pnm. Further, the plurality of pixels P may be divided into a plurality of column groups that are arranged in the second direction X on the substrate 105. The plurality of column groups may include first to n-th column groups P11 to Pn1 and P1m to Pnm.

Further, the substrate 105 may further include dummy regions DPA1 and DPA2 which are positioned in a region of the non-display region NDA that is adjacent to the display region DA and include dummy pixels DP. The dummy regions DPA1 and DPA2 may include a first dummy region DPA1 that is positioned on one side of the display region DA in the first direction Y and a second dummy region DPA2 that is positioned on the other side of the display region DA.

Accordingly, the dummy pixels DP that are included in the first dummy region DPA1 and the second dummy region DPA2 may be positioned on an outside of the outermost pixels P of the display region DA in the first direction Y.

Additionally, as shown in the drawings, an outer region of the non-display region NDA of the substrate 105, which is adjacent to the dummy regions DPA1 and DPA2, is indicated as "outer region" OA.

Unlike the plurality of pixels P that display an image, the dummy pixels DP do not display an image. The dummy pixels DP may be used to form a solvent environment in the neighborhood of the outermost pixels P of the plurality of pixels P when the organic solution is discharged onto the plurality of pixels P in the first direction Y. For example, when the organic solution is discharged onto the plurality of pixels P using a printing method, for example, a nozzle printing method, the organic solution is also discharged onto the dummy pixels DP. In this case, a solvent environment is formed on the pixels P of an edge portion. The drying speed of the organic solvent is generally higher on the pixels P of an edge portion than on the pixels P of the center portion in the first direction Y. Due to the solvent environment, the drying speed of the organic solution that is discharged onto the pixels P of the edge portion may become similar to the drying speed of the organic solution that is discharged onto the pixels P of the center portion. Accordingly, the organic layer that is formed through discharging and drying of the organic solution in the first direction Y may have a uniform shape on the pixels P of the edge portion and the pixels P of the center portion in the first direction Y.

The dummy pixels DP that are included in the first dummy region DPA1 may be arranged in the second direction X and first dummy row groups DP11 to DP1$m$ that are positioned adjacent to the first row groups P11 to P1$m$ may be formed. The dummy pixels DP that are included in the second dummy region DPA2 may be arranged in the second direction X and second dummy row groups DP21 to DP2$m$ that are positioned adjacent to the n-th row groups Pn1 to Pn$m$ may be formed. However, the exemplary embodiment is not limited to such an arrangement.

The substrate 105 may include an insulating substrate. The insulating substrate may be a transparent glass material including, for example, transparent $SiO_2$ as its main component. In some embodiments, the insulating substrate may be made of an opaque material or a plastic material, for example. Further, the insulating substrate may be a flexible substrate.

Although not illustrated, the substrate 105 may further include other structures that are formed on the insulating substrate. Such structures may be, for example, wirings, electrodes, and insulating layers. In some embodiments, the substrate 105 may include, for example, a plurality of thin film transistors that are on the insulating substrate. Drain electrodes of at least a part of the plurality of thin film transistors may be electrically connected to the first electrode 110. The thin film transistor may include, for example, an active region that is made of amorphous silicon, polycrystalline silicon, or single crystalline silicon. In another embodiment, the thin film transistor may include, for example, an active region that is an oxide semiconductor.

The first electrode 110 may be arranged for and corresponds to each pixel P on the substrate 105. The first electrode 110 may be, for example, an anode electrode that receives a signal applied to a drain electrode of the thin film transistor and provides holes to the light emitting layer 160 or a cathode electrode that provides electrons. In this embodiment, the first electrode 110 is exemplified as an anode electrode.

The first electrode 110 may be used as a transparent electrode, a reflective electrode, or a semi-transmission electrode. In the case where the first electrode 110 is used as a transparent electrode, it may be, for example, ITO (Indium Tin Oxide), IZO (Indium Zinc Oxide), ZnO (Zinc Oxide), or $In_2O_3$. In the case where the first electrode 110 is used as a reflective electrode, it may be formed, for example, by forming a reflective layer that is made of Ag, Mg, Al, Pt, Pd, Au, Ni, Nd, Ir, Cr, or a compound thereof and then forming ITO, IZO, ZnO, or $In_2O_3$ thereon. The first electrode 110 may be formed through a photolithography process, for example, but is not limited thereto.

In the case where the first electrode 110 is used as a transparent electrode, the light emitting display device 100 may be, for example, a bottom emission type in which light that is generated from the light emitting layer 160 is discharged in the direction of the first electrode 110. Further, in the case where the first electrode 110 is used as a reflective electrode, the light emitting display device 100 may be, for example, a top emission type in which light that is generated from the light emitting layer 160 is discharged in the direction of the second electrode 190.

The pixel defining layer 120 may be arranged on the substrate 105 to have an opening 121 for exposing the first electrode 110 and to partition respective pixels P on the substrate 105. The pixel defining layer 120 may be made of an insulating material. The pixel defining layer 120 may include, for example, at least one organic material selected from the group including benzocyclobutene (BCB), polyimide (PI), polyamaide (PA), acryl resin, and phenol resin. As another example, the pixel defining layer 120 may include an inorganic material, such as silicon nitride, for example. The pixel defining layer 120 may be formed through a photolithography process, for example, but is not limited thereto.

The hole injection layer 130 may be on the first electrode 110 that is exposed through the opening 121 of the pixel defining layer 120 to cover the pixel defining layer 120 as a whole. The hole injection layer 130 is a buffer layer that lowers an energy barrier between the first electrode 110 and the hole transport layer 150, and may facilitate injection of holes from the first electrode 110 into the hole transport layer 150. The hole injection layer 130 may be made of an organic compound, for example, MTDATA(4,4',4"-tris(3-methylphenylphenylamino)triphenylamine), CuPc (copper phthalocyanine), or PEDOT/PSS(poly(3,4-ethylenedioxythiphene/polystyrene sulfonate), but is not limited thereto. The hole injection layer 130 may be formed through slit coating, for example, but is not limited thereto.

The lyophilic pattern 140 may be arranged on the hole injection layer 130. The lyophilic pattern 140 may be a lyophilic material, for example, which has lyophilicity with respect to a hole transport solution 150$a$ (in FIG. 17) in comparison with the pixel defining layer 120. As a result, a contact angle of the hole transport solution 150$a$ (in FIG. 17) against the lyophilic pattern 140 may be smaller than a contact angle of the hole transport solution 150$a$ (in FIG. 17) against the pixel defining layer 120. For example, the lyophilic pattern 140 may be formed of conductive primer whereby the contact angle of the hole transport solution 150$a$ (in FIG. 17) against the lyophilic pattern 140 is equal to or smaller than about 10°. A discharge device 10 may discharge the hole transport solution 150$a$ (in FIG. 17) onto the lyophilic pattern 140 of the pixels P that are on the same line using the nozzle printing method while moving in the first direction Y. In this case, since the hole transport solution 150*a* (in FIG. 17) has high wettability with respect to the lyophilic pattern 140, the hole transport solution 150*a* (in FIG. 17) may not be spread to the upper surface of the adjacent pixel defining layer 120 in the second direction X, but may stay on the lyophilic pattern 140 of the pixels P that are on the same line in the first direction Y. The term "high wettability" may mean to a great extent that liquid is widely spread on the surface of a solid and comes in contact with the solid.

The lyophilic pattern 140 may be extendedly arranged or extended to cover the first electrodes 110 and the pixel defining layer 120 that are on the same line in the first direction Y on the hole injection layer 130, and extends up to an outer region of the outermost pixels P. Specifically, the lyophilic pattern 140 may include a first lyophilic pattern 142 having a plurality of grooves gp1 on one end portion thereof in the first direction Y and a second lyophilic pattern 144 having a plurality of grooves gp1 on the other end portion thereof in the first direction Y. The first lyophilic pattern 142 and the second lyophilic pattern 144 may be alternately arranged in the second direction X to be spaced apart from each other. The first lyophilic pattern 142 and the second lyophilic pattern 144 may be formed through a photolithography method, for example, but are not limited thereto.

As illustrated in FIG. 2, the first lyophilic pattern 142 may extend, for example, from the outer region OA of the dummy pixel DP11 to the outer region OA of the dummy pixel DP21 in the first direction Y, and the plurality of grooves gp1 are provided in the outer region OA of the dummy pixel DP21. Here, the first direction Y may be a direction in which the hole transport solution 150*a* (in FIG. 17) is discharged using the nozzle printing method, and the outer region OA of the dummy pixel DP21 may be the last portion in the first direction Y when the hole transport solution 150*a* (in FIG. 17) is discharged onto the first lyophilic pattern 142, and may be a region in which the hole transport solution 150*a* (in FIG. 17) has great inertia.

Figure 4:
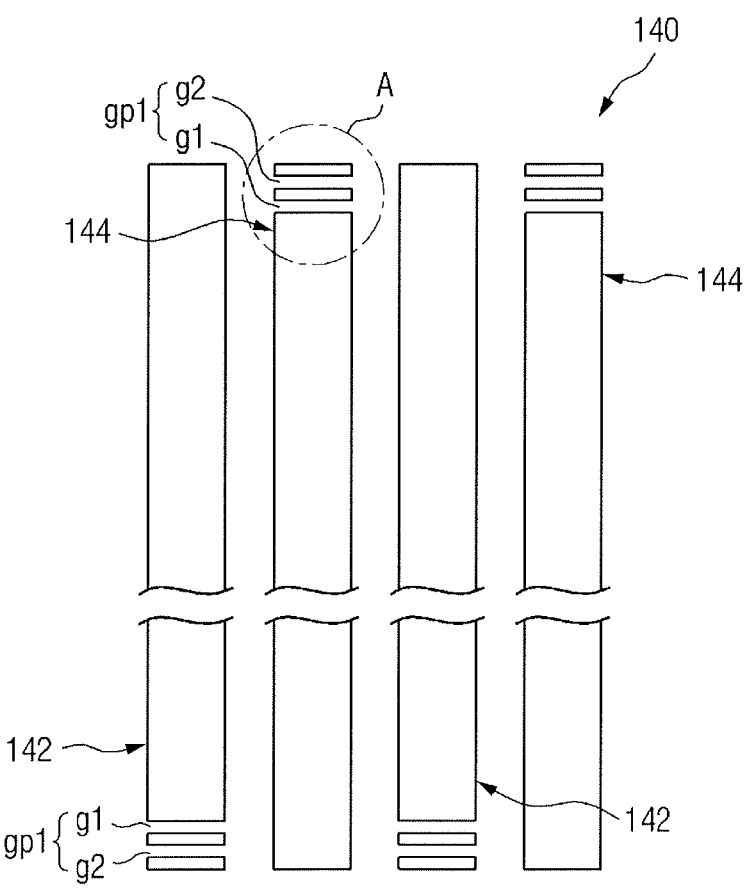
FIG. 4 illustrates a top view of a lyophilic pattern of FIGS. 2 and 3.
Figure 5:
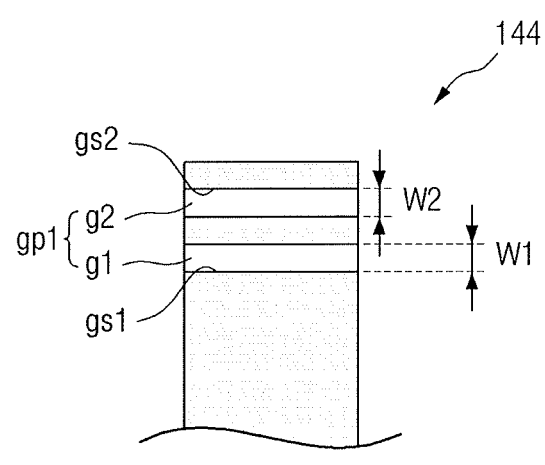
FIG. 5 illustrates an enlarged cross-sectional view of portion A of FIG. 4.

As illustrated in FIG. 4, the plurality of grooves gp1 may include a first groove g1 and a second groove g2 that are spaced apart from each other in the first direction Y, and each of the first groove g1 and the second groove g2 may be in the form of a straight line that extends in the second direction X and have sidewalls gs1 and gs2, respectively. The width W1 of the first groove g1 and the second width W2 of the second groove g2 may be equal to each other in the first direction Y. The first groove g1 and the second groove g2 may form roughness on the one end portion of the first lyophilic pattern 142 in the first direction Y. Accordingly, when the hole transport solution 150*a* (in FIG. 17), which flows from the outer region OA of the dummy pixel DP11 to the outer region OA of the dummy pixel DP21 in the first direction Y is discharged onto the first lyophilic pattern 142 using the nozzle printing method through the first groove g1 and the second groove g2, the first lyophilic pattern 142 increases the contact angle of the hole transport solution 150*a* (in FIG. 17) with respect to the one end portion of the first lyophilic pattern 142. Accordingly, the hole transport solution 150*a* (in FIG. 17) may be confined in the plurality of grooves gp1 while being prevented from seceding to the outside of the outer region OA of the dummy pixel DP21.

That is, when the hole transport solution 150*a* (in FIG. 17), which flows from the outer region OA of the first dummy pixel DP11 to the outer region OA of the dummy pixel DP21 in the first direction Y, is discharged onto the first lyophilic pattern 142 using the nozzle printing method, the first lyophilic pattern 142 increases a resistive force acting against the inertia of the hole transport solution 150*a* (in FIG. 17) in the outer region OA of the dummy pixel DP21 through the first groove g1 and the second groove g2. Accordingly, the hole transport solution 150*a* (in FIG. 17) may be confined in the plurality of grooves gp1 while being prevented from seceding to the outside of the outer region OA of the dummy pixel DP21. Through this, continuous spreading of the hole transport solution 150*a* (in FIG. 17) to the outside of the outer region OA of the dummy pixel DP21 may be reduced or prevented.

The outer region OA of the dummy pixel DP11 is the first portion in the first direction Y when the hole transport solution 150*a* (in FIG. 17) is discharged onto the first lyophilic pattern 142, and a region in which the hole transport solution 150*a* (in FIG. 17) does not have great inertia. Accordingly, when the hole transport solution 150*a* (in FIG. 17) is discharged onto the first lyophilic pattern 142 of the outer region OA of the dummy pixel DP11, it does not secede to the outside of the outer region OA of the dummy pixel DP11.

As illustrated in FIG. 3, the second lyophilic pattern 144 may extend, for example, from the outer region OA of the dummy pixel DP22 to the outer region OA of the dummy pixel DP 12 in the first direction Y, and the plurality of grooves gp1 are provided in the outer region OA of the dummy pixel DP12. Here, the outer region OA of the dummy pixel DP12 may be the last portion in the first direction Y when the hole transport solution 150*a* (in FIG. 17) is discharged onto the second lyophilic pattern 144, and may be a region in which the hole transport solution 150*a* (in FIG. 17) has great inertia.

As illustrated in FIG. 4, the plurality of grooves gp1 of the second lyophilic pattern 144 may include a first groove g1 and a second groove g2 that are spaced apart from each other in the first direction Y, and each of the first groove g1 and the second groove g2 may be in the form of a straight line that extends in the second direction X. The first groove g1 and the second groove g2 form roughness on one end portion of the second lyophilic pattern 144 in the first direction Y. Accordingly, when the hole transport solution 150*a* (in FIG. 17), which flows from the outer region OA of the dummy pixel DP22 to the outer region OA of the dummy pixel DP 12 in the first direction Y, is discharged onto the second lyophilic pattern 144 using the nozzle printing method through the first groove g1 and the second groove g2, the second lyophilic pattern 144 increases the contact angle of the hole transport solution 150*a* (in FIG. 17) with respect to the one end portion of the second lyophilic pattern 144. Accordingly, the hole transport solution 150*a* (in FIG. 17) may be confined in the plurality of grooves gp1 while being prevented from seceding to the outside of the outer region OA of the dummy pixel DP12.

That is, when the hole transport solution 150*a* (in FIG. 17), which flows from the outer region OA of the dummy pixel DP22 to the outer region OA of the dummy pixel DP12 in the first direction Y, is discharged onto the second lyophilic pattern 144 using the nozzle printing method, the second lyophilic pattern 144 increases a resistive force acting against the inertia of the hole transport solution 150*a* (in FIG. 17) in the outer region OA of the dummy pixel DP12 through the first groove g1 and the second groove g2. Accordingly, the hole transport solution 150*a* (in FIG. 17) may be confined in the plurality of grooves gp1 while being prevented from seceding to the outside of the outer region OA of the dummy pixel DP12. Through this, continuous spreading of the hole transport solution 150a (in FIG. 17) to the outside of the outer region OA of the dummy pixel DP 12 may be reduced or prevented.

The outer region OA of the dummy pixel DP22 is the first portion in the first direction Y when the hole transport solution 150a (in FIG. 17) is discharged onto the second lyophilic pattern 144, and a region in which the hole transport solution 150a (in FIG. 17) does not have great inertia. Accordingly, when the hole transport solution 150a (in FIG. 17) is discharged onto the second lyophilic pattern 144 of the outer region OA of the dummy pixel DP22, it does not secede to the outside of the outer region OA of the dummy pixel DP22.

When the discharge device 10 discharges the hole transport solution 150a (in FIG. 17) onto the lyophilic pattern 140 of the pixels P that are on the same line using the nozzle printing method while moving in the first direction Y, the lyophilic pattern 140 as configured above may make the edge portion of the hole transport solution 150a (in FIG. 17) that is discharged onto the first lyophilic pattern 142 and the edge portion of the hole transport solution 150a (in FIG. 17) that is discharged onto the second lyophilic pattern 144 coincide with each other on respective sides of the first lyophilic pattern 142 and the second lyophilic pattern 144 and on the other respective sides of the first lyophilic pattern 142 and the second lyophilic pattern 144. This arrangement is possible due to the first lyophilic pattern 142 provided with a plurality of grooves gp1 that are positioned on one end portion in the first direction Y and the second lyophilic pattern 144 provided with a plurality of grooves gp1 that are positioned on the other end portion in the first direction Y.

Accordingly, the drying speed of the hole transport solution 150a (in FIG. 17) that is discharged onto the first lyophilic pattern 142 and the drying speed of the hole transport solution 150a (in FIG. 17) that is discharged onto the second lyophilic pattern 144 may become uniform and, thus, the shape of the portion of the hole transport layer 150, on which the hole transport solution 150a (in FIG. 17) that is discharged onto the first lyophilic pattern 142 is dried and formed, and the shape of the portion of the hole transport layer 150, on which the hole transport solution 150a (in FIG. 17) that is discharged onto the second lyophilic pattern 144 is dried and formed, may also become uniform.

The hole transport layer 150 may be arranged on the lyophilic pattern 140. The hole transport layer 150 may be conformal or conformally formed along the first lyophilic pattern 142 and the second lyophilic pattern 144. The hole transport layer 150 may fill in the plurality of grooves gp1 of the first lyophilic pattern 142 and the plurality of grooves gp1 of the second lyophilic pattern 144. The hole transport layer 150 receives holes from the hole injection layer 130 through the lyophilic pattern 140. The hole transport layer 150 may transfer or connect the holes that are provided from the hole injection layer 130 through the lyophilic pattern 140 to the light emitting layer 160. The hole transport layer 150 may be made of an organic compound, for example, TPD (N,N'-diphenyl-N,N'-bis(3-methylphenyl)-1,1'-bi-phenyl-4,4'-diamine) or NPB(N,N'-di(naphthalen-1-yl)-N,N'-diphenyl-benzidine), but is not limited thereto. The hole transport layer 150 may be formed in a manner that the discharge device 10, which moves in the first direction Y, discharges the hole transport solution 150a (in FIG. 17) onto the lyophilic pattern 140 of the pixels P that are on the same line in the first direction Y and dries the discharged hole transport solution 150a using the nozzle printing method, for example, that is advantageous to uniformly form the thin film, but is not limited thereto.

The light emitting layer 160 may be on the hole transport layer 150. The light emitting layer 160 emits light through recombination of holes provided from the first electrode 110 and electrons provided from the second electrode 190. More specifically, if the holes and the electrons are provided to the light emitting layer 160, they are recombined to form excitons. As the excitons are transited from an excited state to a ground state, the light emitting layer 160 emits light. The light emitting layer 160 may include a red light emitting layer that emits red light, a green light emitting layer that emits green light, and a blue light emitting layer that emits blue light. The light emitting layer 160 may be formed, for example, using an inkjet printing method or a nozzle printing method, but is not limited thereto.

The red light emitting layer may include one red light emitting material or to include a host and a red dopant. The host of the red light emitting layer may be, for example, $Alq_3$(tris(8-quinolinorate)aluminum), CBP(4,4'-N,N'-dicarbazol-biphenyl), PVK(ploy(n-vinylcarbazole)), ADN(9,10-Di(naphthyl-2-yl)anthrace), TCTA(4,4',4"-tris(N-carbazolyl)triphenylamine), TPBI(1,3,5-tris(N-phenylbenzimidazol-2-yl)benzene), TBADN(3-tert-butyl-9,10-di(naphth-2-yl) anthracene), E3(ter-fluorene), and DSA (distyrylarylene), but are not limited thereto. Further, the red dopant may be PtOEP, $Ir(piq)_3$, or $Btp_2Ir(acac)$, for example, but is not limited thereto.

The green light emitting layer may include one green light emitting material or include a host and a green dopant. As the host of the green light emitting layer, the host of the red light emitting layer may be used. Further, the green dopant may be, for example, $Ir(ppy)_3$, $Ir(ppy)_2(acac)$, or $Ir(mpyp)_3$, but is not limited thereto.

The blue light emitting layer may include one blue light emitting material or include a host and a blue dopant. As the host of the blue light emitting layer, the host of the red light emitting layer may be used. Further, the blue dopant may be, for example, $F_2Irpic$, $(F_2ppy)_2Ir(tmd)$, $Ir(dfppz)_3$, ter-fluorene, DPAVBi(4,4'-bis(4-diphenylaminostyryl) biphenyl), or TBPe(2,5,8,11-tetra-ti-butyl pherylene), but is not limited thereto.

The electron transport layer 170 is arranged on the light emitting layer 160, and receives electrons from the second electrode 190 through the electron injection layer 180. The electron transport layer 170 transfers or connects the electrons that are provided from the second electrode 190 through the electron injection layer 180 to the light emitting layer 160. The electron transport layer 170 may be made of an organic compound, for example, Bphen(4,7-diphenyl-1,10-phenanthroline), BAlq(aluminum(III)bis(2-methyl-8-hydroxyquinolinato)4-phenylphenolate), $Alq_3$(tris(8-quinolinorate)aluminum), $Bebq_2$(berylliumbis(benzoquinolin-10-olate), or TPBI(1,3,5-tris(N-phenylbenzimidazole-2-yl) benzene), but is not limited thereto. The electron transport layer 170 may be formed through a deposition process, for example, but is not limited thereto.

The electron injection layer 180 may be on the electron transport layer 170 and may receive electrons from the second electrode 190. The electron injection layer 180 may be a buffer layer that lowers an energy barrier between the electron transport layer 170 and the second electrode 190, and may facilitate electron injection from the second electrode 190 into the electron transport layer 170. The electron injection layer 180 may be, for example, LiF or CsF, but is not limited thereto. The electron injection layer 180 may be formed through a deposition process, for example, but is not limited thereto.

The second electrode 190 may be on the electron injection layer 180 and may be, for example, a cathode electrode that provides electrons to the light emitting layer 160 or an anode electrode that provides holes to the light emitting layer 160. In this embodiment, the second electrode 190 is exemplified as a cathode electrode. In the same manner as the first electrode 110, the second electrode 190 may be used as a transparent electrode or a reflective electrode. The second electrode 190 may be formed through a deposition process, for example, but is not limited thereto.

Although not illustrated, the light emitting display device 100 may further include an encapsulation substrate that is arranged on an upper portion of the second electrode 190. The encapsulation substrate may be made of an insulating substrate. A spacer may be arranged between the second electrode 190 and the encapsulation substrate on the pixel defining layer 120. In some embodiments, the encapsulation substrate may be omitted. In this case, an encapsulation layer that is made of an insulating material may cover the entire structure for protection.

As described above, the light emitting display device 100 according to an exemplary embodiment includes the first lyophilic pattern 142 provided with a plurality of grooves gp1 that are positioned on one end portion in the first direction Y and the second lyophilic pattern 144 provided with a plurality of grooves gp1 that are positioned on the other end portion in the first direction Y. When the discharge device 10 discharges the hole transport solution 150a (in FIG. 17) onto the lyophilic pattern 140 of the pixels P that are on the same line while moving in the first direction Y, the hole transport solution 150a (in FIG. 17) may be prevented from seceding to the outside of the outer region OA of the dummy pixel in the first direction Y.

Accordingly, the edge portion of the hole transport solution 150a (in FIG. 17) that is discharged onto the first lyophilic pattern 142 may coincide with the edge portion of the hole transport solution 150a (in FIG. 17) that is discharged onto the second lyophilic pattern 144 on respective sides of the first lyophilic pattern 142 and the second lyophilic pattern 144 and on the other respective sides of the first lyophilic pattern 142 and the second lyophilic pattern 144.

Additionally, the drying speed of the hole transport solution 150a (in FIG. 17) that is discharged onto the first lyophilic pattern 142 and the drying speed of the hole transport solution 150a (in FIG. 17) that is discharged onto the second lyophilic pattern 144 may become uniform. Thus, the shape of the portion of the hole transport layer 150, on which the hole transport solution 150a (in FIG. 17) that is discharged onto the first lyophilic pattern 142 is dried and formed, and the shape of the portion of the hole transport layer 150, on which the hole transport solution 150a (in FIG. 17) that is discharged onto the second lyophilic pattern 144 is dried and formed, may also become uniform. In this case, the hole transport layer 150 that is formed through drying of the hole transport solution 150a (in FIG. 17) may be uniformly formed as a whole, and the light emitting layer 160 that is formed on the hole transport layer 150 may be uniformly formed as a whole. As a result, the light emitting characteristics may become entirely uniform and, thus, the display quality of the light emitting display device 100 may be improved.

Figure 6:
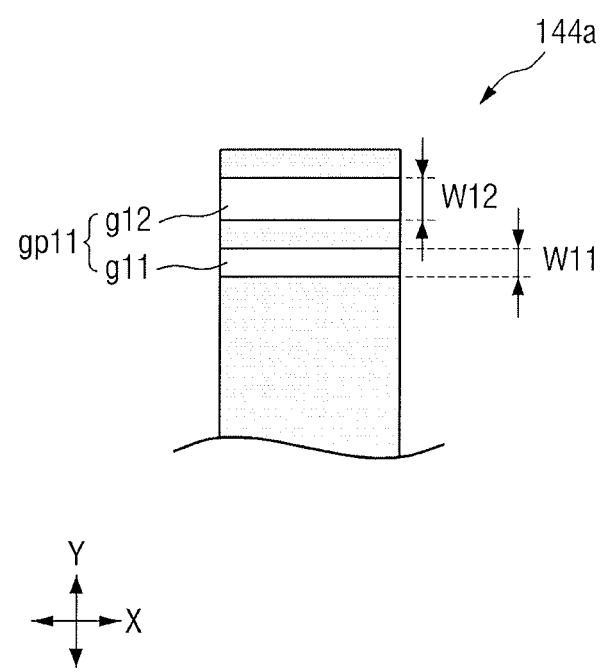
FIGS. 6 to 8 illustrate top views illustrating various embodiments of a lyophilic pattern.
Figure 7:
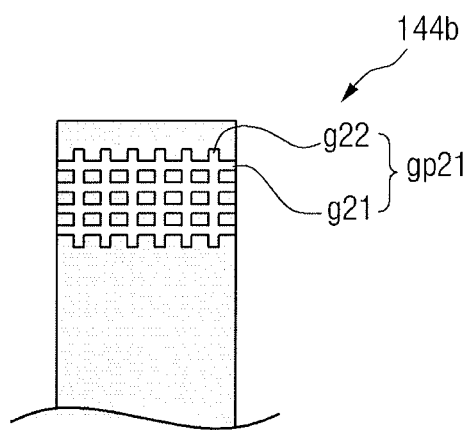
Figure 8:
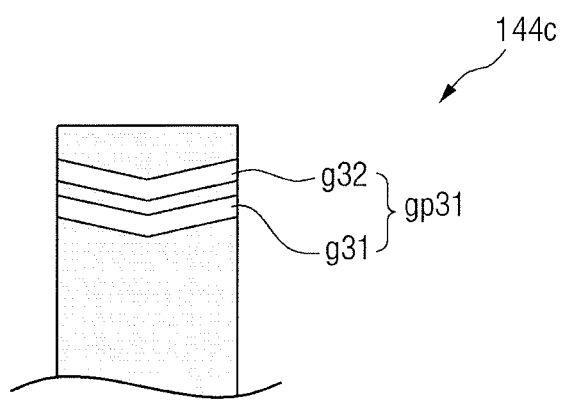
Figure 8:
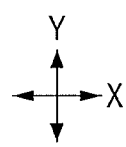

FIGS. 6 to 8 are top views illustrating various embodiments of a lyophilic pattern. Although FIGS. 6 to 8 exemplify the second lyophilic pattern, the first lyophilic pattern may also be formed in the same manner as the second lyophilic pattern.

FIG. 6 exemplifies that a plurality of grooves gp11 of the second lyophilic pattern 144a include a first groove g11 and a second groove g12, and the width W12 of the second groove g12 that is positioned on an outside of the first groove g11 in the first direction Y is larger than the width W11 of the first groove g11.

The second lyophilic pattern 144a further increases the resistive force acting against the inertia of the hole transport solution 150a (in FIG. 17) in the outer region OA of the dummy pixel DP12 and, thus, may prevent the hole transport solution 150a (in FIG. 17) from seceding to the outside of the outer region OA of the dummy pixel DP12 more effectively.

FIG. 7 exemplifies that a plurality of grooves gp21 of the second lyophilic pattern 144b include first grooves g21 and second grooves g22, and are in the form of a lattice. That is, the first grooves g21 are in the form of a straight line that extends in the second direction X, and the second grooves g22 are in the form of a straight line that extends in the first direction Y and cross the first grooves g21.

The second lyophilic pattern 144b further increases the resistive force acting against the inertia of the hole transport solution 150a (in FIG. 17) in the outer region OA of the dummy pixel DP12 and, thus, may prevent the hole transport solution 150a (in FIG. 17) from seceding to the outside of the outer region OA of the dummy pixel DP12 more effectively.

FIG. 8 exemplifies that a plurality of grooves gp31 of the second lyophilic pattern 144c include a first groove g31 and a second groove g32, and each of the first groove g31 and the second groove g32 is in the form of at least one slanted line between the first direction Y and the second direction X.

The second lyophilic pattern 144c further increases the resistive force acting against the inertia of the hole transport solution 150a (in FIG. 17) in the outer region OA of the dummy pixel DP12 and, thus, may prevent the hole transport solution 150a (in FIG. 17) from seceding to the outside of the outer region OA of the dummy pixel DP12 more effectively.

Figure 9:
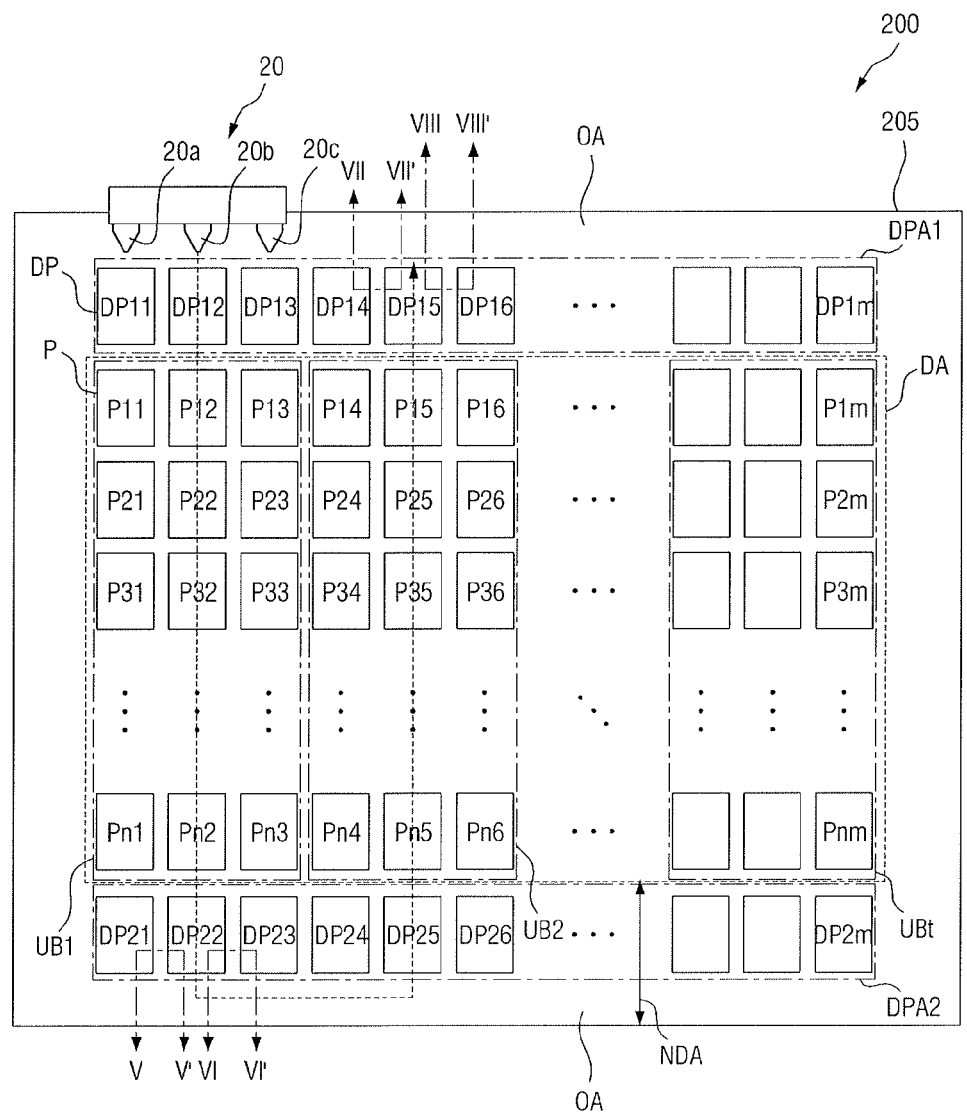
FIG. 9 illustrates a schematic top view illustrating pixels of a light emitting display device according to another exemplary embodiment.
Figure 10:
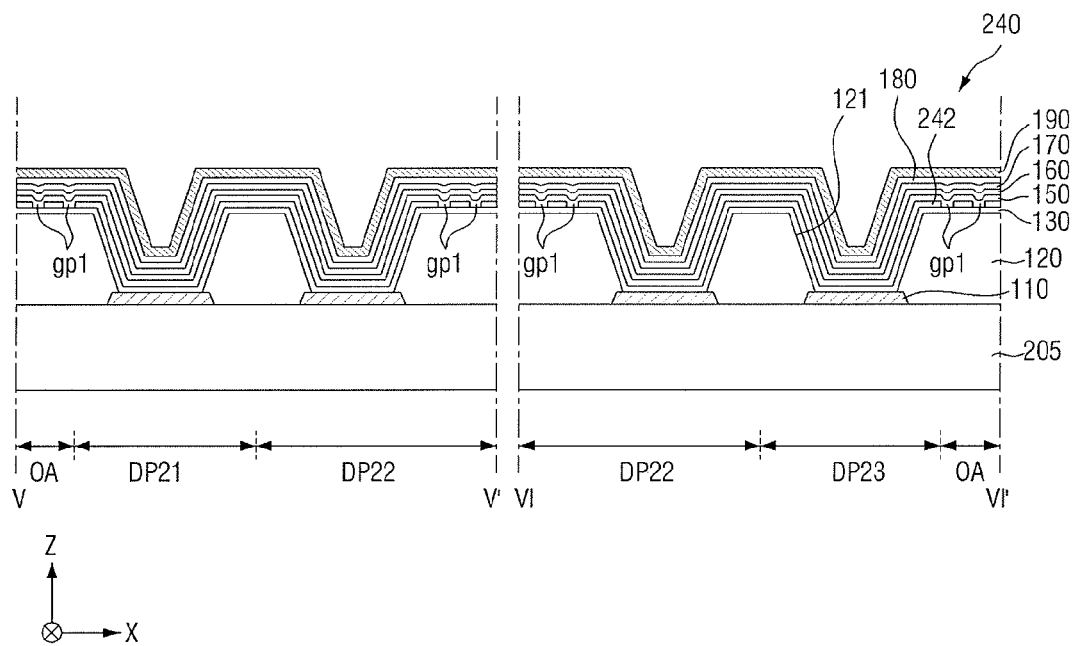
FIG. 10 illustrates a cross-sectional view of a portion that is taken along lines V-V' and VI-VI' of FIG. 9.
Figure 11:
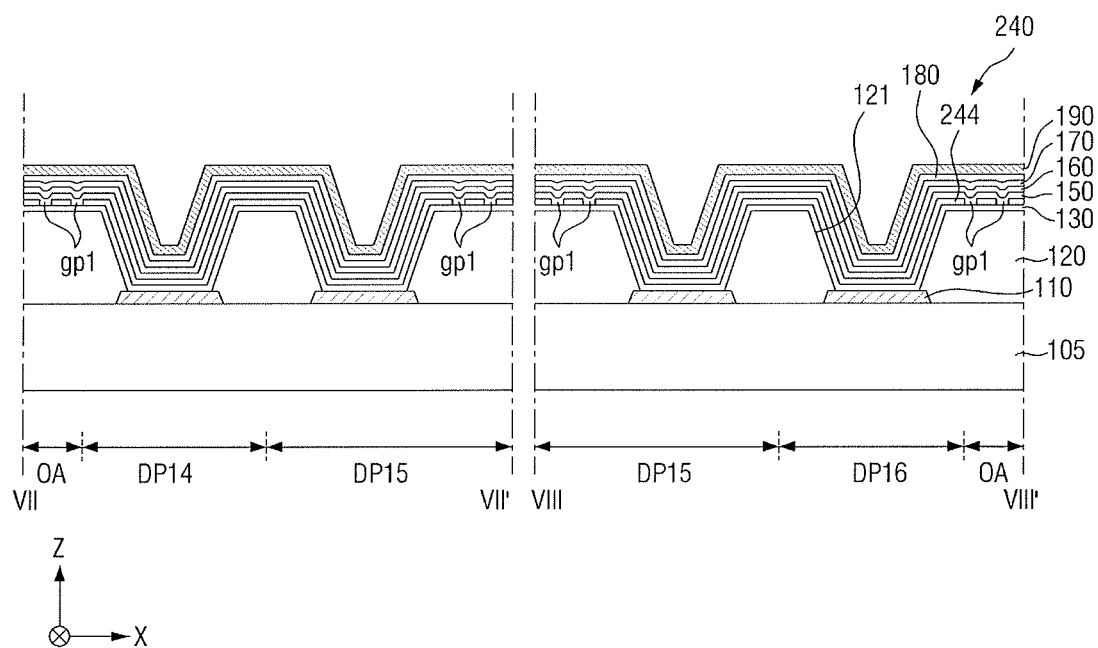
FIG. 11 illustrates a cross-sectional view of a portion that is taken along lines VII-VII' and VIII-VIII' of FIG. 1.
Figure 12:
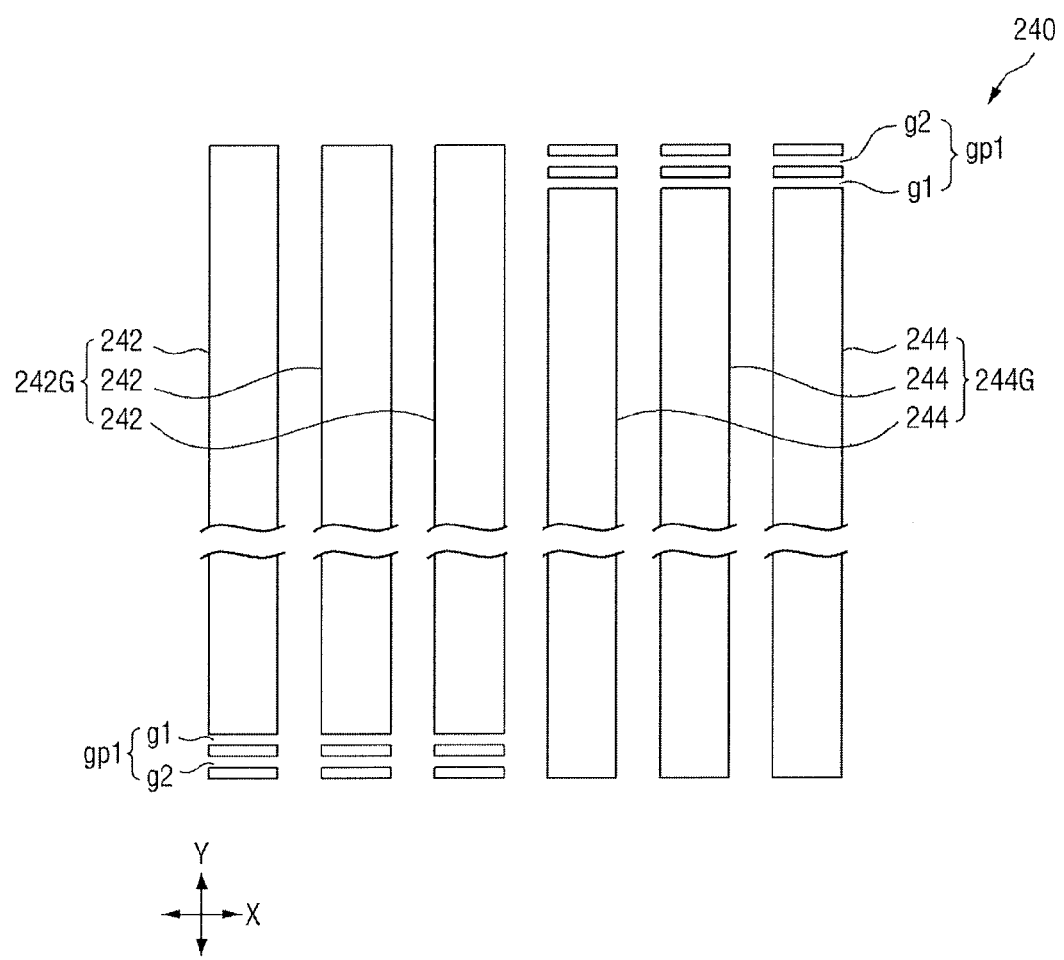
FIG. 12 illustrates a top view of a lyophilic pattern of FIGS. 10 and 11.

FIG. 9 is a schematic top view illustrating pixels of a light emitting display device according to another exemplary embodiment, and FIG. 10 is a cross-sectional view of a portion that is taken along lines V-V' and VI-VI' of FIG. 9. FIG. 11 is a cross-sectional view of a portion that is taken along lines VII-VII' and VIII-VIII' of FIG. 1, and FIG. 12 is a top view of a lyophilic pattern of FIGS. 10 and 11.

Referring to FIGS. 9 to 12, a light emitting display device 200 according to another exemplary embodiment has the same configuration as the light emitting display device 100 of FIG. 2 except for a substrate 205 and a lyophilic pattern 240. Accordingly, only the substrate 205 and the lyophilic pattern 240 in the light emitting display device 200 according to another exemplary embodiment will be described, herein.

A light emitting display device 200 according to another exemplary embodiment includes a substrate 205, a first electrode 110, a pixel defining layer 120, a hole injection layer 130, a lyophilic pattern 240, a hole transport layer 150, a light emitting layer 160, an electron transport layer 170, an electron injection layer 180, and a second electrode 190. Respective members are successively laminated in the Z direction of FIG. 10.

The substrate 205 is similar to the substrate 105 of FIGS. 1 and 2. However, a plurality of pixels P defined on the substrate 205 may be divided into a plurality of unit pixel blocks that include a plurality of pixel column groups. The plurality of unit pixel blocks may include first to t-th unit pixel blocks UB1 to UBt (t is a natural number that is equal to or larger than 2). The number of the plurality of pixel column groups that are included in each of the plurality of unit pixel blocks may be the same. For example, the first unit pixel block UB1 may include a first pixel column group P11 to Pn1, a second pixel column group P12 to Pn2, and a third pixel column group P13 to Pn3. The second unit pixel block UB2 may include a fourth pixel column group P14 to Pn4, a fifth pixel column group P15 to Pn5, and a sixth pixel column group P16 to Pn6.

Each unit pixel block may include three pixel column groups, for example, when a discharge device 20 has three nozzles 20a, 20b, and 20c. An organic solution. for example, may be discharged from the first nozzle 20a to the pixels P corresponding to the first column group P11 to Pn1 of the first unit block UB1 through a nozzle printing method. Further, the organic solution may be discharged from the second nozzle 20b to the pixels P corresponding to the second column group P12 to Pn2 of the first unit block UB1, and the organic solution may be discharged from the third nozzle 20c to the pixels P corresponding to the third column group P13 to Pn3 of the first unit block UB1.

As described above, the number of pixel column groups included in each unit pixel block may be the same as the number of nozzles included in one discharge device.

The lyophilic pattern 240 is similar to the lyophilic pattern 140 of FIG. 2. However, the lyophilic pattern 240 includes a first lyophilic pattern group 242G including first lyophilic patterns 242 having a plurality of grooves gp1 on one end portion thereof in the first direction Y and a second lyophilic pattern group 244G including second lyophilic patterns 244 having a plurality of grooves gp1 on the other end portion thereof in the first direction Y. Further, the first lyophilic pattern group 242G and the second lyophilic pattern group 244G are alternately arranged in the second direction X. The first lyophilic pattern group 242G and the second lyophilic pattern group 244G may be formed through a photolithography method, for example, but are not limited thereto.

The first patterns 242 of the first lyophilic pattern group 242G may be arranged on the hole injection layer 130 to be spaced apart from each other in the second direction X. For example, the first patterns 242 may correspond to the first column group P11 to Pn1, the second column group P12 to Pn2, and the third column group P13 to Pn3 of the first unit block UB1.

Specifically, the first lyophilic pattern group 242G may extend from the outer region OA of the dummy pixel DP11 to the outer region OA of the dummy pixel DP21 in the first direction Y, and as illustrated in FIG. 10, may include the first lyophilic pattern 242 having the plurality of grooves gp1 in the outer region OA of the dummy pixel DP21. Further, the first lyophilic pattern group 242G may extend from the outer region OA of the dummy pixel DP12 to the outer region OA of the dummy pixel DP22 in the first direction Y and, as illustrated in FIG. 10, may include the first lyophilic pattern 242 having the plurality of grooves gp1 in the outer region OA of the dummy pixel DP22. Further, the first lyophilic pattern group 242G may extend from the outer region OA of the dummy pixel DP13 to the outer region OA of the dummy pixel DP23 in the first direction Y and, as illustrated in FIG. 10, may include the first lyophilic pattern 242 having the plurality of grooves gp1 in the outer region OA of the dummy pixel DP23.

The shape and the role of the first lyophilic pattern 242 are the same as the shape and the role of the first lyophilic pattern 142 according to an embodiment described above. Accordingly, duplicate explanation thereof will be omitted. Additionally, although FIG. 12 illustrates that the first lyophilic pattern group 242G includes three first lyophilic patterns 242, two or four or more first lyophilic patterns 242 may be included in the first lyophilic pattern group 242G.

The second patterns 244 of the second lyophilic pattern group 244G may be arranged on the hole injection layer 130 to be spaced apart from each other in the second direction X. For example, the second patterns 244 may correspond to the fourth column group P14 to Pn4, the fifth column group P15 to Pn5, and the sixth column group P16 to Pn6 of the second unit block UB2.

Specifically, the second lyophilic pattern group 244G may extend from the outer region OA of the dummy pixel DP24 to the outer region OA of the dummy pixel DP14 in the first direction Y and, as illustrated in FIG. 11, may include the second lyophilic pattern 244 having the plurality of grooves gp1 in the outer region OA of the dummy pixel DP14. Further, the second lyophilic pattern group 244G may extend from the outer region OA of the dummy pixel DP25 to the outer region OA of the dummy pixel DP15 in the first direction Y and, as illustrated in FIG. 11, may include the second lyophilic pattern 244 having the plurality of grooves gp1 in the outer region OA of the dummy pixel DP15. Further, the second lyophilic pattern group 244G may extend from the outer region OA of the dummy pixel DP26 to the outer region OA of the dummy pixel DP16 in the first direction Y and, as illustrated in FIG. 11. may include the second lyophilic pattern 244 having the plurality of grooves gp1 in the outer region OA of the dummy pixel DP16.

The shape and the role of the second lyophilic pattern 244 are the same as the shape and the role of the second lyophilic pattern 144 according to an embodiment described above. Accordingly, duplicate explanation thereof will be omitted. Additionally, although FIG. 12 illustrates that the second lyophilic pattern group 244G includes three second lyophilic patterns 244, two or four or more second lyophilic patterns 244 may be included in the second lyophilic pattern group 244G. However, the number of second lyophilic patterns 244 included in the second lyophilic pattern group 244G is preferably the same as the number of the first lyophilic patterns 242 included in the first lyophilic pattern group 242G.

As described above, the light emitting display device 200 according to another exemplary embodiment may include the first lyophilic pattern group 242G including the first lyophilic patterns 242 provided with the plurality of grooves gp1 that are positioned on one end portion in the first direction Y and the second lyophilic pattern group 244G including the second lyophilic patterns 244 provided with a plurality of grooves gp1 that are positioned on the other end portion in the first direction Y, and when the discharge device 20 discharges the hole transport solution 150a (in FIG. 17) onto the lyophilic pattern 240 of the pixels P that are on the same line, while moving in the first direction Y, the hole transport solution 150a (in FIG. 17) may be prevented from seceding to the outside of the outer region OA of the dummy pixel in the first direction Y.

Accordingly, the edge portion of the hole transport solution 150a (in FIG. 17) that is discharged onto the first lyophilic pattern group 242G may coincide with the edge portion of the hole transport solution 150a (in FIG. 17) that is discharged onto the second lyophilic pattern group 244G on respective sides of the first lyophilic pattern group 242G and the second lyophilic pattern group 244G and on the other respective sides of the first lyophilic pattern group 242G and the second lyophilic pattern group 244G.

Accordingly, the drying speed of the hole transport solution 150a (in FIG. 17) that is discharged onto the first lyophilic pattern group 242G and the drying speed of the hole transport solution 150a (in FIG. 17) that is discharged onto the second lyophilic pattern group 244G may become uniform and, thus, the shape of the portion of the hole transport layer 150, on which the hole transport solution 150a (in FIG. 17) that is discharged onto the first lyophilic pattern group 242G is dried and formed, and the shape of the portion of the hole transport layer 150, on which the hole transport solution 150a (in FIG. 17) that is discharged onto the second lyophilic pattern group 244G is dried and formed, may also become uniform. In this case, the hole transport layer 150 that is formed through drying of the hole transport solution 150a (in FIG. 17) may be uniformly formed as a whole, and the light emitting layer 160 that is formed on the hole transport layer 150 may be uniformly formed as a whole. As a result, the light emitting characteristics may become entirely uniform and, thus, the display quality of the light emitting display device 200 may be improved.

Hereinafter, an exemplary method for fabricating the light emitting display device according to the exemplary embodiments described above will be described.

FIGS. 13 to 22 are cross-sectional views and perspective views explaining a method for fabricating a light emitting display device according to an exemplary embodiment. In FIGS. 13 to 22, portions taken along lines I-I' and of FIG. 1 are exemplarily illustrated.

Figure 13:
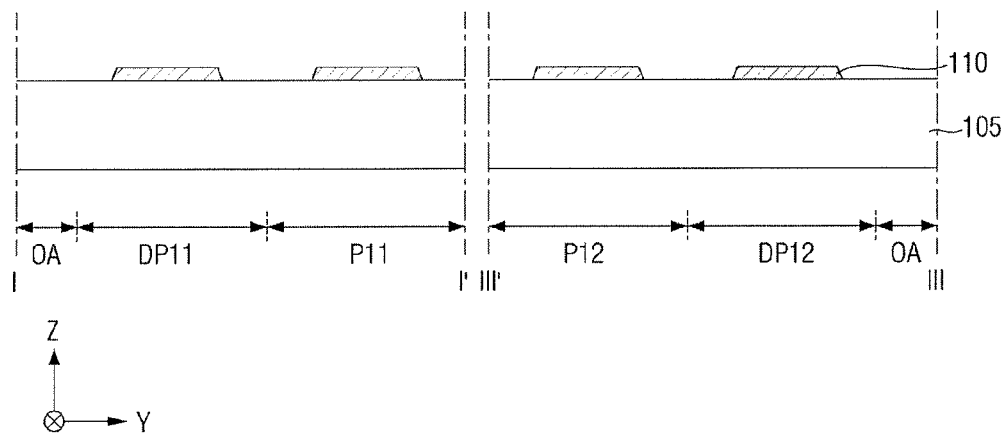
FIGS. 13 to 22 illustrate cross-sectional views and perspective views explaining a method for fabricating a light emitting display device according to an exemplary embodiment.

First, referring to FIG. 13, a first electrode 110 may be formed for each pixel on a substrate 105 on which a plurality of pixels P (in FIG. 1) are defined. The first electrode 110 may be formed, for example, by depositing and patterning a transparent electrode material or a reflective material on the substrate 105.

Figure 14:
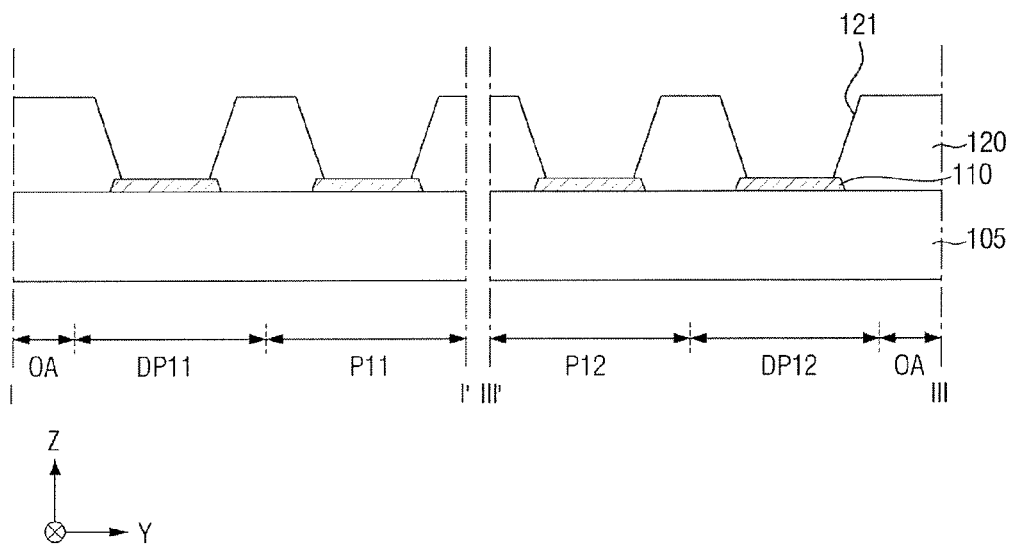

Then, referring to FIG. 14, a pixel defining layer 120, which partitions respective pixels P (in FIG. 1) and has an opening 121 for exposing the first electrode 110, may be formed on the substrate 105. The pixel defining layer 120 may be formed, for example, by depositing an insulating material on the whole surface of the substrate 105 to cover the first electrode 110 and patterning the deposited insulating material.

Figure 15:
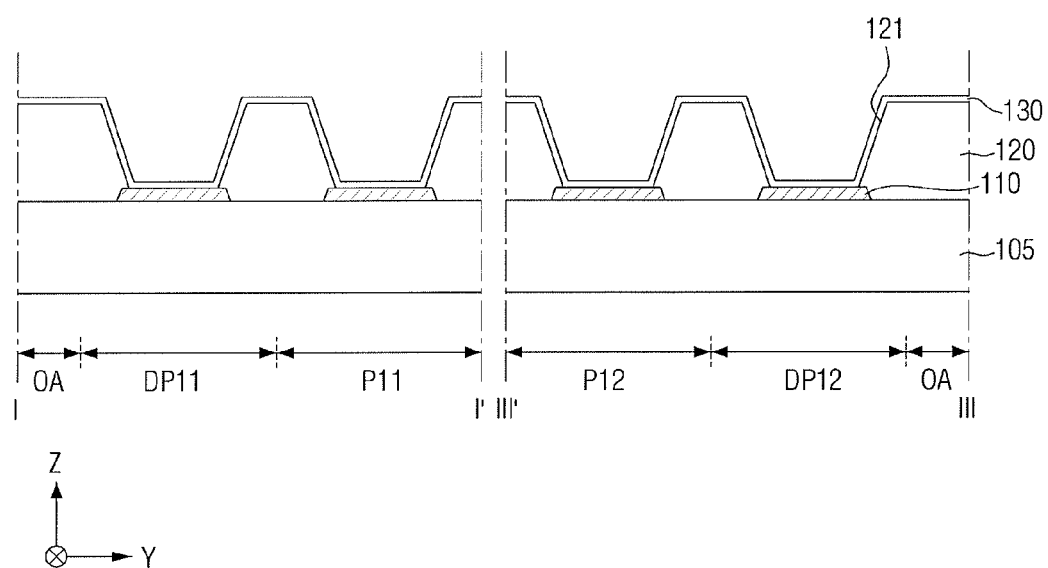

Then, referring to FIG. 15, a hole injection layer 130 may be formed on the first electrode 110. The hole injection layer 130 may be formed on not only the first electrode 110 but also the whole surface of the pixel defining layer 120 using slit coating, for example.

Figure 16:
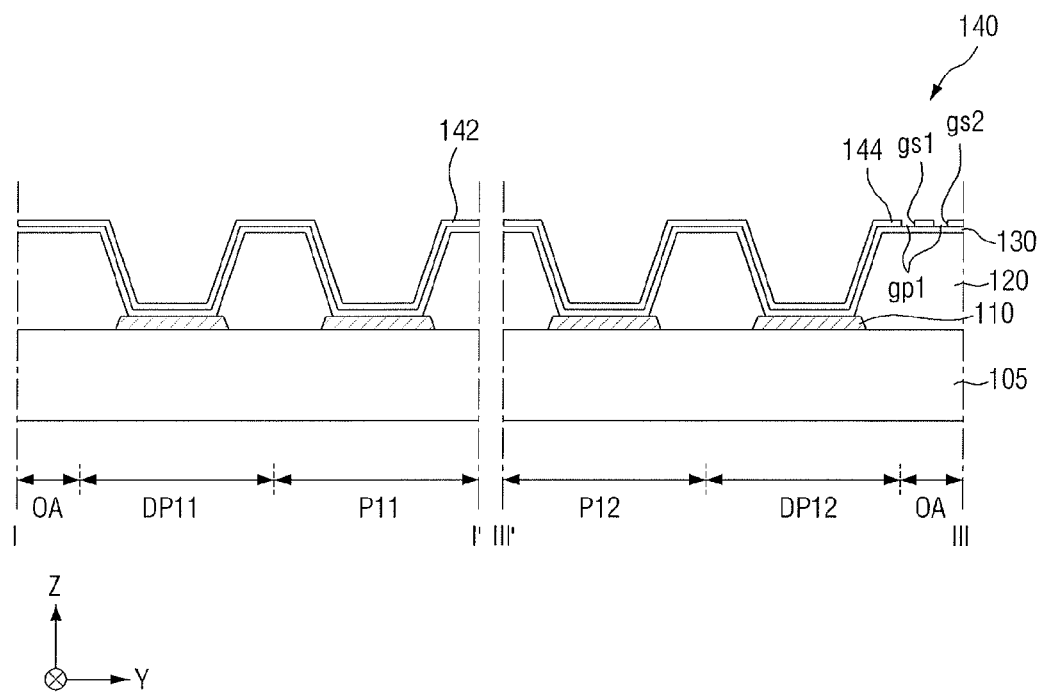

Then, referring to FIG. 16, a lyophilic pattern 140 may be formed, which is extendedly arranged or extends to cover the first electrodes 110 and the pixel defining layer 120 that are on the same line in the first direction Y on the hole injection layer 130, and includes a first lyophilic pattern 142 and a second lyophilic pattern 144 that may extend up to an outer region of the outermost pixels P.

The first lyophilic pattern 142 and the second lyophilic pattern 144 may be alternately arranged in the second direction X. The first lyophilic pattern 142 may be formed to have a plurality of grooves gp1 on one end portion in the first direction Y, and the second lyophilic pattern 144 may be formed to have a plurality of grooves gp1 on the other end portion in the first direction Y.

The first lyophilic pattern 142 and the second lyophilic pattern 144 may be formed through a photolithography method, for example. On the other hand, the first lyophilic pattern 142 and the second lyophilic pattern 144 may be formed of conductive primer, for example, so that they have lyophilicity with respect to a hole transport solution 150a (in FIG. 17) in comparison to the pixel defining layer 120. As a result, a contact angle of the hole transport solution 150a (in FIG. 17) against the first lyophilic pattern 142 and the second lyophilic pattern 144 may be smaller than a contact angle of the hole transport solution 150a (in FIG. 17) against the pixel defining layer 120.

Figure 17:
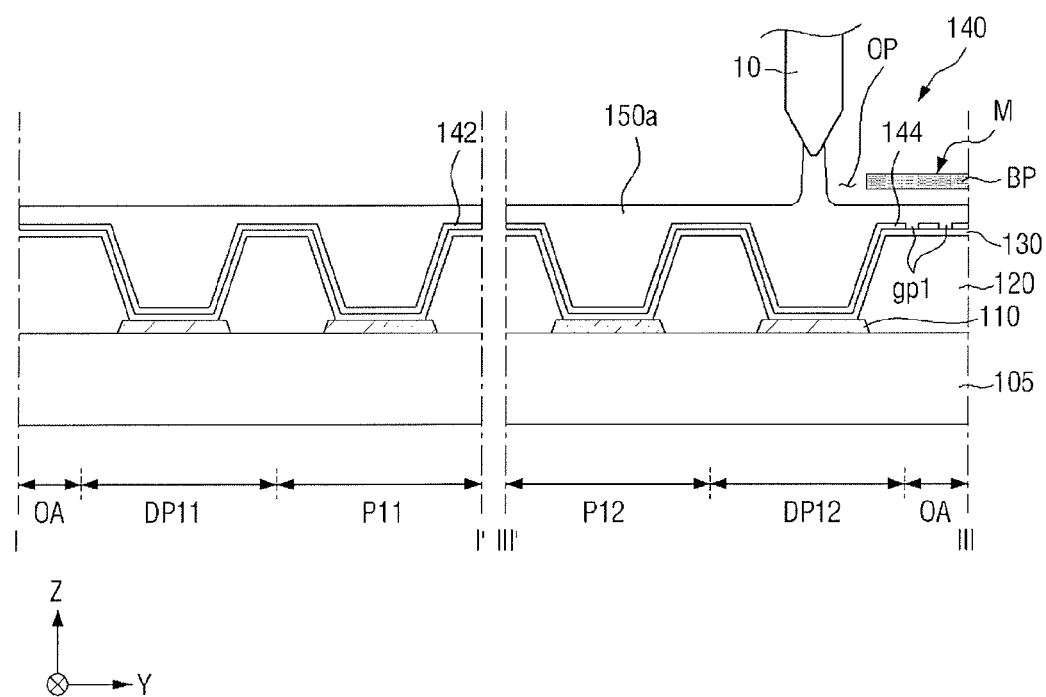
Figure 18:
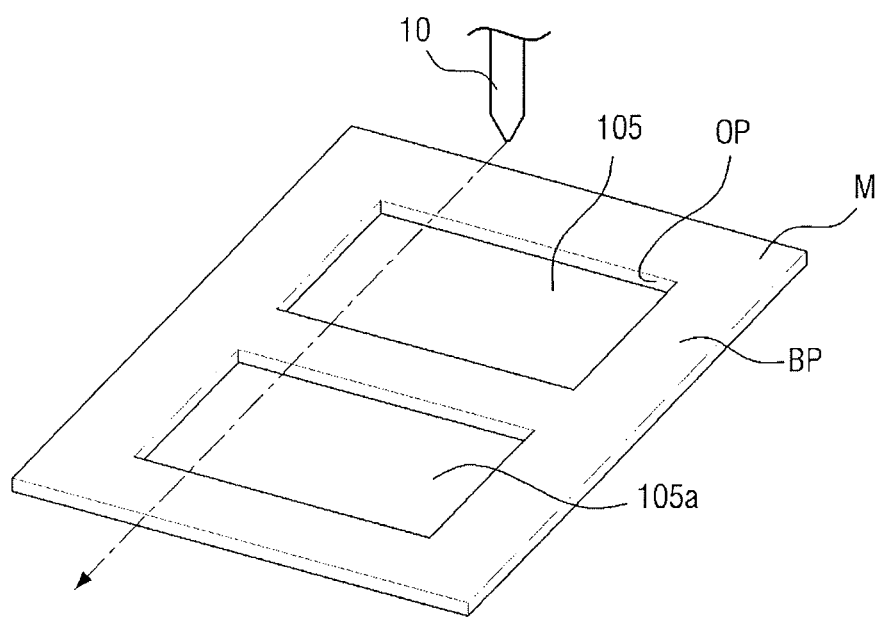
Figure 19:
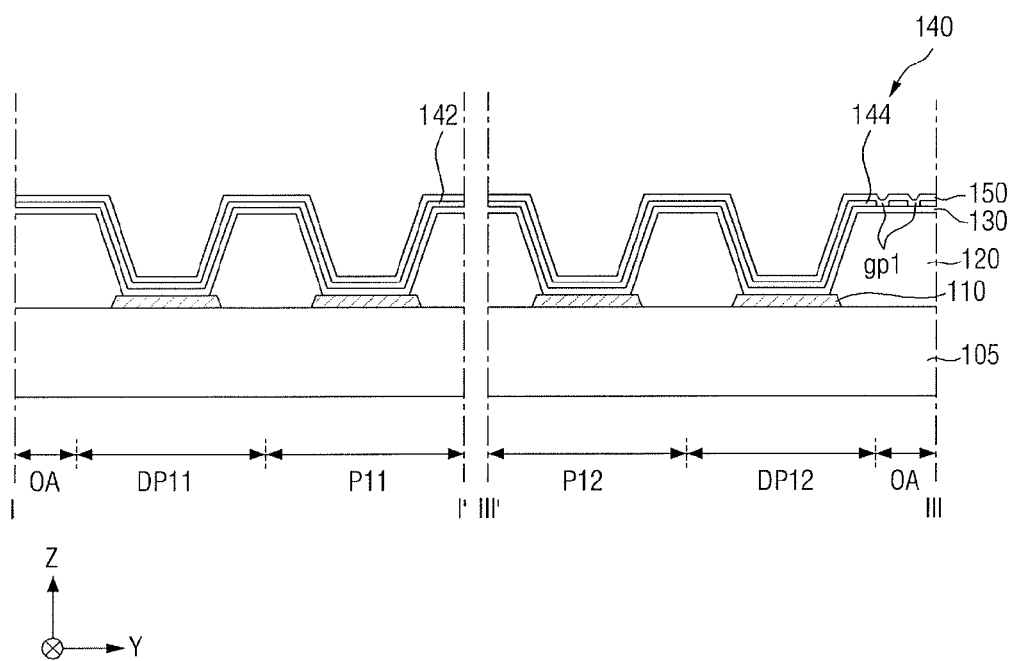

Referring to FIGS. 17 to 19, a hole transport layer 150 may be formed on the lyophilic pattern 140.

Specifically, as illustrated in FIG. 17, a discharge device 10 discharges the hole transport solution 150a onto the lyophilic pattern 140 using a nozzle printing method, for example, so that the hole transport solution 150a is discharged from an outer region OA of a dummy pixel DP11 to an outer region OA of a dummy pixel DP21 and from an outer region OA of a dummy pixel DP22 to an outer region OA of a dummy pixel DP12 in the first direction Y. In this case, a cover mask M may be arranged between the lyophilic pattern 140 and the discharge device 10. FIG. 18 exemplifies that the cover mask M may be applied to a mother panel that includes a region in which the substrate 105 for one light emitting display device is to be formed and a region in which a substrate 105a for another light emitting display device is to be formed.

As illustrated in FIG. 18, the cover mask M may include an open portion OP for exposing at least a part of the plurality of pixels P (in FIG. 1) of a display region DA (in FIG. 1) of the substrate 105, and a blocking portion BP positioned on an outside of the open portion OP.

In forming the hole transport layer 150 and the light emitting layer 160 on the plurality of pixels P (in FIG. 1) of the display region DA (in FIG. 1) using the nozzle printing method, the cover mask M may be used to prevent a hole transport solution and a light emitting solution from flowing to the outside of the plurality of pixels P (in FIG. 1) and forming an organic layer in a region in which a contact region or a sealing member is to be formed. Through this, a separate process for removing the organic layer that is formed through flowing of the solution to the outside of the plurality of pixels P (in FIG. 1) may be omitted.

When the discharge device 10 discharges the hole transport solution 150a in the first direction Y, for example, from the outer region OA of the dummy pixel DP22 to the outer region OA of the dummy pixel DP12, the hole transport solution 150a has great inertia in the outer region OA of the dummy pixel DP12 that may become close to the blocking portion BP of the cover mask M. In order to increase the resistive force that acts against the inertia of the hole transport solution 150a in the outer region OA of the dummy pixel DP12, a plurality of grooves gp1 may be formed on the other end portion of the second lyophilic pattern 144 as illustrated in FIG. 17. In this case, the hole transport solution 150a may be prevented from further flowing from the outer region OA of the dummy pixel DP12 to the outside.

Although not illustrated, in the first direction Y, for example, from the outer region OA of the dummy pixel DP22 to the outer region OA of the dummy pixel DP12, when the discharge device 10 discharges the hole transport solution 150a, the cover mask M may shift the open portion OP toward the blocking portion BP where the discharge of the hole transport solution 150a starts. That is, where the discharge of the hole transport solution 150a goes from the blocking portion BP to the open portion of the cover mask M, rather than from the open portion OP to the blocking portion BP. For example, the cover mask M may move to the outer region OA of the dummy pixel DP11 in the first direction Y. This is to make an edge portion that is formed through discharge of the hole transport solution 150a to the outer region OA of the dummy pixel DP11 and an edge portion that is formed through discharge of the hole transport solution 150a to the outer region OA of the dummy pixel DP12 coincide with each other by discharging the hole transport solution 150a to the outer region OA of the dummy pixel DP11 without interfering with the blocking portion BP of the cover mask M.

Thereafter, through drying of the hole transport solution 150a that is discharged onto the lyophilic pattern 140, a uniform hole transport layer 150 as shown in FIG. 19 may be formed.

Figure 20:
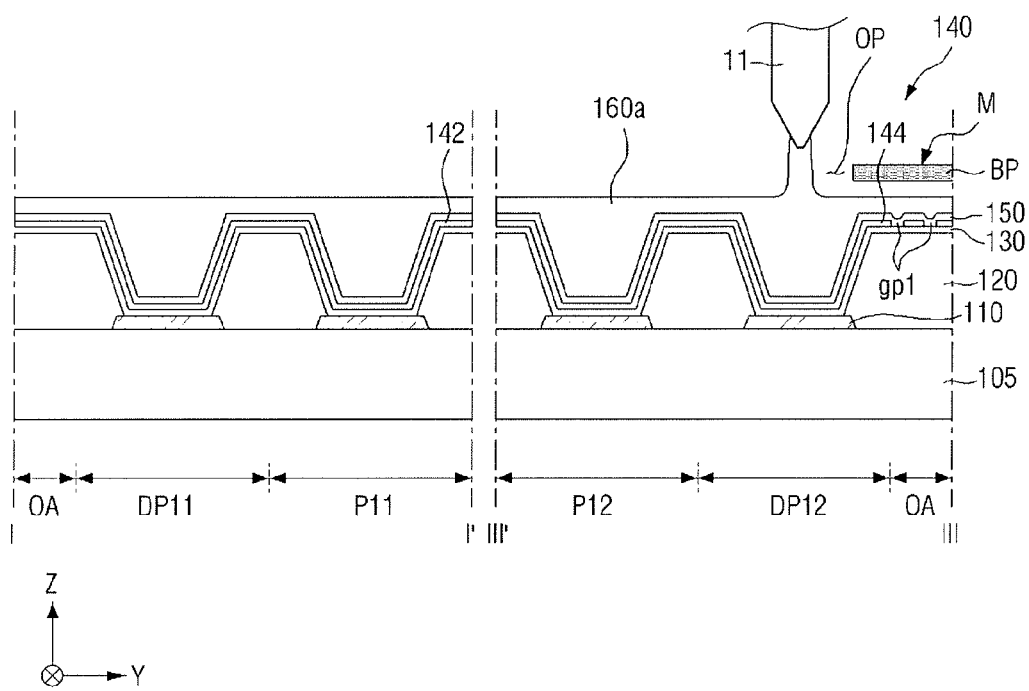
Figure 21:
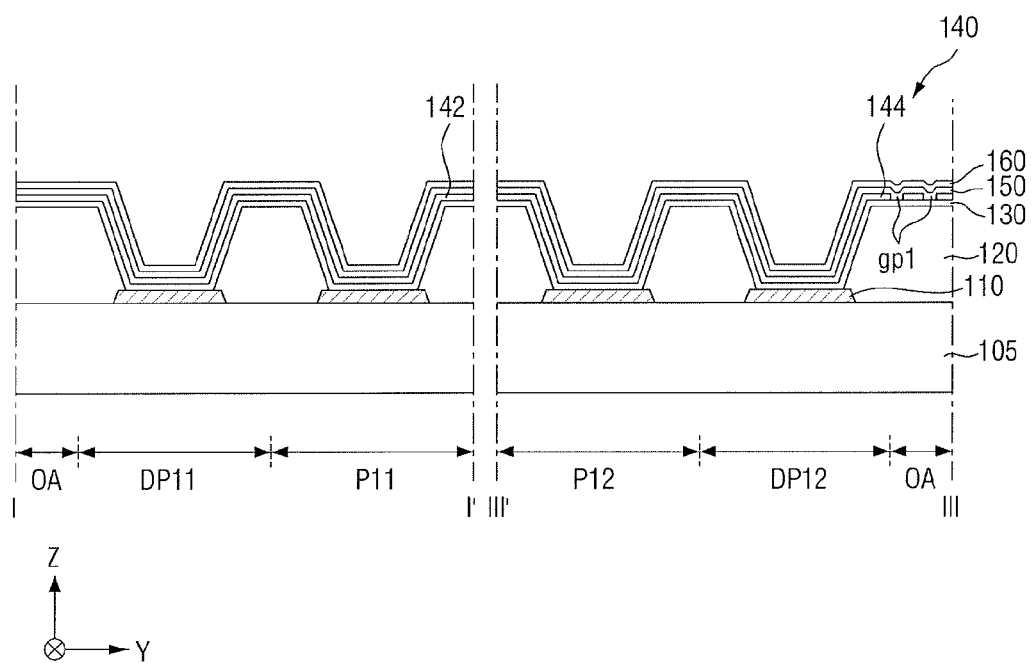

Then, referring to FIGS. 20 and 21, the light emitting layer 160 may be formed on the hole transport layer 150.

Specifically, as illustrated in FIG. 20, a discharge device 11 discharges a light emitting solution 160a onto the hole transport layer 150 using a nozzle printing method, for example, so that the light emitting solution 160a is discharged from the outer region OA of the dummy pixel DP11 to the outer region OA of the dummy pixel DP21 and from the outer region OA of the dummy pixel DP22 to the outer region OA of the dummy pixel DP12 in the first direction Y. In this case, a cover mask M may be arranged between the hole transport layer 150 and the discharge device 11. The light emitting layer 160 may be formed in the same manner as the hole transport layer 150.

Thereafter, through drying of the light emitting solution 160a that is discharged onto the hole transport layer 150, a uniform light emitting layer 160 as shown in FIG. 21 may be formed.

Figure 22:
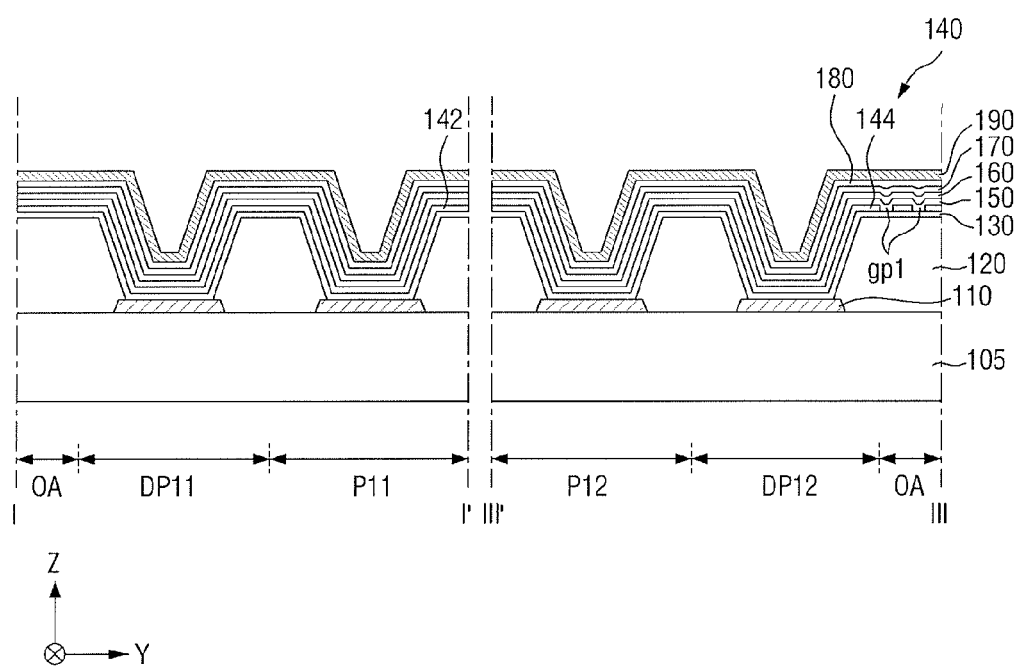

Then, referring to FIG. 22, an electron transport layer 170, an electron injection layer 180, and a second electrode 190 may be formed on the light emitting layer 160. The electron transport layer 170, the electron injection layer 180, and the second electrode 190 may be formed through a deposition process, for example.

Although not illustrated, the method for fabricating a light emitting display device according to an exemplary embodiment may further include arranging an encapsulation substrate on an upper portion of the second electrode 190. Further, the method for fabricating a light emitting display device according to an exemplary embodiment may further include arranging a spacer between the second electrode 190 and the encapsulation substrate. Since various methods to arrange the encapsulation substrate and to arrange the spacer are widely known in the art, detailed explanation thereof will be omitted.

By way of summation and review, the hole transport layer and the light emitting layer may be formed in the form of a thin film through discharging of a solution into the opening of the pixel defining layer through a discharge device having at least one nozzle using an inkjet printing method or a nozzle printing method. The inkjet printing method is a method to drop a material to be printed onto a desired position in the form of ink drops, and the nozzle printing method is a method to make a material to be printed flow to a desired position along a line that includes the desired position in the form of a solution.

In forming an organic layer, for example, a hole transport layer and a light emitting layer formed on a substrate through discharge of an organic solution using a nozzle printing method, the organic solution may be discharged onto not only a display region of the substrate but also a non-display region thereof to form the organic layer. In this case, a separate process is required to eliminate the organic layer that is formed on the non-display region, for example, a contact region of a circuit portion or a region on which a sealing member is to be formed.

The separate process may make the whole manufacturing process complicated and, in order to omit the separate process, a process may be performed to discharge the organic solution on the substrate using the nozzle printing method in a state where a cover mask that includes an open portion for exposing the display region of the substrate and a blocking portion for covering the non-display region is arranged on the substrate.

However, in the case where the organic solution is discharged onto the substrate using the nozzle printing method, the organic solution has great inertia closer to the blocking portion of the mask when the organic solution is discharged in a direction from the open portion to the blocking portion of the cover mask. In this case, the organic solution may continuously flow from the outline of the substrate that is on a lower portion of one side of the blocking portion of the cover mask toward the outside. In contrast, in the case where the organic solution is discharged from the blocking portion of the cover mask toward the open portion, the organic solution is first discharged from portions of the substrate corresponding to the boundary between one side of the blocking portion and the open portion of the cover mask.

Accordingly, positions of ends of organic solution layers that are formed through discharge of the organic solution onto the substrate may differ on the basis of one side of the blocking portion of the cover mask being in a direction that is vertical to the direction in which the organic solution is discharged. In this case, the organic layers that are formed through drying of the organic solution layers may have different shapes and, thus, light emission characteristics by lines of the organic layers may become non-uniform and deteriorate the display quality of the light emitting display device.

Accordingly, exemplary embodiments may provide a light emitting display device and a method for fabricating a light emitting display device which may improve the display quality through making the light emission characteristics thereof uniform. As such, the light emitting display device according to exemplary embodiments may have uniform light emission characteristics which may improve the display quality.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light emitting display device comprising:
 a substrate including a plurality of pixels that are arranged in a first direction and in a second direction, the second direction crossing the first direction;
 a plurality of first electrodes for the plurality of pixels on the substrate;

a pixel defining layer on the substrate, the pixel defining layer having openings for exposing the plurality of first electrodes;

a hole injection layer on the plurality of first electrodes;

a lyophilic pattern extending on the hole injection layer to cover the plurality of first electrodes and the pixel defining layer that are on a same line in the first direction, and extending up to an outer region of outermost pixels of the plurality of pixels in the first direction;

a hole transport layer on the lyophilic pattern;

a light emitting layer on the hole transport layer; and a second electrode on the light emitting layer, wherein the lyophilic pattern includes a first lyophilic pattern having a plurality of grooves on one end portion of the lyophilic pattern in the first direction and a second lyophilic pattern having a plurality of grooves on another end portion of the lyophilic pattern in the first direction, and wherein the first lyophilic pattern and the second lyophilic pattern are alternately arranged in the second direction.

2. The light emitting display device as claimed in claim 1, wherein the plurality of grooves of the first and second lyophilic patterns are in a form of a straight line that extends in the second direction.

3. The light emitting display device as claimed in claim 1, wherein the plurality of grooves of the first and second lyophilic patterns have a same width.

4. The light emitting display device as claimed in claim 1, wherein widths of the plurality of grooves of the first and second lyophilic patterns become larger from an inside to an outside in the first direction.

5. The light emitting display device as claimed in claim 2, wherein the plurality of grooves of the first and second lyophilic patterns are in a form of a lattice.

6. The light emitting display device as claimed in claim 1, wherein the plurality of grooves of the first and second lyophilic patterns are in a form of a slant line between the first direction and the second direction.

7. The light emitting display device as claimed in claim 1, wherein the hole transport layer is conformal along the first lyophilic pattern and the second lyophilic pattern.

8. The light emitting display device as claimed in claim 1, wherein the substrate further includes dummy pixels arranged on an outside of the outermost pixels in the first direction.

9. The light emitting display device as claimed in claim 1, wherein the plurality of pixels include pixels that emit a same light emission color in the first direction.

10. A light emitting display device comprising:
a substrate including a plurality of pixels that are arranged in a first direction and in a second direction, the second direction crossing the first direction;

a plurality of first electrodes for the plurality of pixels on the substrate;

a pixel defining layer on the substrate, the pixel defining layer having openings for exposing the plurality of first electrodes;

a hole injection layer on the plurality of first electrodes;

a lyophilic pattern extending on the hole injection layer to cover the plurality of first electrodes and the pixel defining layer that are on a same line in the first direction, and extending up to an outer region of outermost pixels of the plurality of pixels in the first direction;

a hole transport layer on the lyophilic pattern;

a light emitting layer on the hole transport layer; and a second electrode on the light emitting layer, wherein the lyophilic pattern includes a first lyophilic pattern group including first lyophilic patterns having a plurality of grooves formed on one end portion of the lyophilic pattern in the first direction and a second lyophilic pattern group including second lyophilic patterns having a plurality of grooves formed on another end portion of the lyophilic pattern in the first direction, and wherein the first lyophilic pattern group and the second lyophilic pattern group are alternately arranged in the second direction.

11. The light emitting display device as claimed in claim 10, wherein the plurality of grooves of the first and second lyophilic patterns are in a form of a straight line that extends in the second direction.

12. The light emitting display device as claimed in claim 10, wherein the plurality of grooves of the first and second lyophilic patterns are in a form of a lattice.

13. The light emitting display device as claimed in claim 10, wherein the plurality of grooves of the first and second lyophilic patterns are in a form of a slant line between the first direction and the second direction.

14. The light emitting display device as claimed in claim 10, wherein the hole transport layer is conformal along the first lyophilic pattern and the second lyophilic pattern.

15. The light emitting display device as claimed in claim 10, wherein the substrate further includes dummy pixels arranged on an outside of the outermost pixels in the first direction.

16. The light emitting display device as claimed in claim 11, wherein the plurality of pixels include pixels that emit a same light emission color in the first direction.

17. A method for fabricating a light emitting display device, comprising:
forming a plurality of first electrodes for a plurality of pixels on a substrate, the plurality of pixels which are arranged in a first direction and in a second direction, the second direction crossing the first direction;

forming a pixel defining layer partitioning the plurality of pixels on the substrate and having openings for exposing the plurality of first electrodes;

forming a hole injection layer on the plurality of first electrodes;

forming a lyophilic pattern extending on the hole injection layer to cover the plurality of first electrodes and the pixel defining layer that are on a same line in the first direction, and extending up to an outer region of outermost pixels of the plurality of pixels in the first direction;

forming a hole transport layer on the lyophilic pattern;

forming a light emitting layer on the hole transport layer; and forming a second electrode on the light emitting layer, wherein the forming the lyophilic pattern includes alternately arranging a first lyophilic pattern having a plurality of grooves formed on one end portion of the lyophilic pattern in the first direction and a second lyophilic pattern having a plurality of grooves formed on another end portion of the lyophilic pattern in the first direction.

18. The method as claimed in claim 17, wherein the hole transport layer and the light emitting layer are formed by a nozzle printing method.

19. The method as claimed in claim 18, wherein the hole transport layer is formed by discharging a hole transport solution onto the lyophilic pattern in the first direction using a discharge device, and drying the discharged hole transport solution in a state where a cover mask is on an upper portion of the lyophilic pattern, the cover mask including an open portion for exposing the pixels and a blocking portion positioned on an outside of the open portion.

20. The method as claimed in claim 19, wherein the cover mask moves to shift the open portion toward the blocking portion when the discharging of the hole transport solution begins and is performed in a direction from the blocking portion to the open portion of the cover mask, rather than a direction from the open portion to the blocking portion.

* * * * *